United States Patent
Morozumi

(10) Patent No.: US 6,710,460 B2
(45) Date of Patent: Mar. 23, 2004

(54) SEMICONDUCTOR DEVICES AND METHODS FOR MANUFACTURING THE SAME

(75) Inventor: Yukio Morozumi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 65 days.

(21) Appl. No.: 10/160,884

(22) Filed: Jun. 3, 2002

(65) Prior Publication Data

US 2002/0139572 A1 Oct. 3, 2002

Related U.S. Application Data

(62) Division of application No. 09/775,474, filed on Feb. 3, 2001, now Pat. No. 6,498,090.

(30) Foreign Application Priority Data

Feb. 3, 2000 (JP) .......................................... 2000-26367

(51) Int. Cl.[7] .......................... H01L 23/48; H01L 23/52; H01L 29/40
(52) U.S. Cl. ...................... 257/779; 257/780; 257/781; 257/737; 257/750; 257/752; 438/612
(58) Field of Search ................. 257/779–781, 257/737, 750, 752; 438/612

(56) References Cited

U.S. PATENT DOCUMENTS

| | | | | |
|---|---|---|---|---|
| 5,016,087 A | * | 5/1991 | Haug et al. | 257/750 |
| 5,172,212 A | * | 12/1992 | Baba | 257/738 |
| 6,180,505 B1 | * | 1/2001 | Uzoh | 438/614 |
| 6,191,023 B1 | | 2/2001 | Chen | 438/612 |
| 6,198,170 B1 | | 3/2001 | Zhao | 257/784 |
| 6,362,528 B2 | * | 3/2002 | Anand | 257/758 |
| 6,376,353 B1 | * | 4/2002 | Zhou et al. | 438/612 |
| 6,399,477 B2 | | 6/2002 | Morozumi | 438/622 |
| 6,555,459 B1 | * | 4/2003 | Tokushige et al. | 438/612 |
| 6,559,545 B2 | | 5/2003 | Morozumi | 257/758 |
| 2002/0146901 A1 | | 10/2002 | Morozumi | 438/622 |

FOREIGN PATENT DOCUMENTS

| | | |
|---|---|---|
| EP | 0913863 | 5/1999 |
| JP | 11135506 | 5/1999 |

* cited by examiner

*Primary Examiner*—David A. Zarneke
(74) *Attorney, Agent, or Firm*—Konrad Raynes & Victor, LLP; Alan S. Raynes

(57) ABSTRACT

In a method for manufacturing a semiconductor device in which wiring layers are formed by a damascene method, certain embodiments relate to a manufacturing method and a semiconductor device, in which a bonding pad section having a multiple-layered structure can be formed by a simple method without increasing the number of process steps. One embodiment includes a method for manufacturing a semiconductor device in which at least an uppermost wiring layer is formed by a damascene method. The method includes the following steps of: (a) forming an uppermost dielectric layer 22 in which an uppermost wiring layer is formed; (b) forming a wiring groove for the wiring layer having a specified pattern and an opening section for bonding pad section in the uppermost dielectric layer 22; (c) forming a first conduction layer for the wiring layer; (d) forming a second conduction layer over the first conduction layer, the second conduction layer composed of a different material from a material of the first conduction layer; and (e) planarizing the second conduction layer, the first conduction layer and the dielectric layer, to thereby form a wiring layer 62 composed of the first conduction layer in the wiring groove and a base conduction layer 82 composed of the first conduction layer and an exposed conduction layer 84 composed of the second conduction layer in the opening section for bonding pad section.

6 Claims, 3 Drawing Sheets

SEMICONDUCTOR DEVICES AND METHODS FOR MANUFACTURING THE SAME

This application is a divisional of Ser. No. 09/775,474 is now U.S. Pat. No. 6,498,090 filed Feb. 3, 2001, which is hereby incorporated by reference in its entirety. Japanese Patent Application No. 2000-26367(P), filed Feb. 3, 2000, is hereby incorporated by reference in its entirety. U.S. Pat. No. 6,399,477, filed on Feb. 3, 2001, is hereby incorporated by reference in its entirety.

TECHNICAL FIELD

The present invention relates to semiconductor devices and methods for manufacturing semiconductor devices, and more particularly, preferred embodiments relate to semiconductor devices with a bonding pad section (an electrode for external connection) that has a characteristic structure and methods for manufacturing the same.

RELATED ART

As semiconductor devices have been further miniaturized in recent years, wiring layers are formed in multiple layers in many more occasions. In a process for manufacturing semiconductor devices, the number of process steps for forming wiring layers and contact layers for electrically connecting the wiring layers has increased with respect to the total number of process steps required for manufacturing the semiconductor devices. Accordingly, the method for forming wiring layers and contact layers has currently become an important issue in the process for manufacturing semiconductor devices. So-called damascene methods are known among methods that facilitate the formation of wiring layers and contact layers.

In a damascene method, specified wiring grooves are formed in a dielectric layer, a wiring material such as aluminum alloy or copper is deposited in the wiring grooves, excess portions of the wiring material are polished and removed by a chemical-mechanical polishing method (hereafter referred to as a "CMP" method) to embed the wiring material in the wiring grooves to form wiring layers. In particular, when copper is used as the wiring material, a reactive ion etching is difficult to employ, and the use of a damascene method is considered to be more promising. Many techniques in the damascene methods have been proposed. For example, Japanese laid-open patent application HEI 11-135506 describes a method for manufacturing a bonding pad section in a wiring structure that is formed by a damascene method.

In accordance with the manufacturing method of Japanese laid-open patent application HEI 11-135506, the bonding pad section is formed in a manner described as follows. A copper wiring is formed over an uppermost dielectric layer by a damascene method. Then, a dielectric protection layer is formed over the entire surface of the dielectric layer and the copper wiring. The dielectric protection layer is patterned to form an opening section in a region where a bonding pad section is to be formed. Then, a copper oxide film on the surface of the copper wiring, which is formed during a step of removing a resist layer or a photo-etching step, is removed by a dry etching method, and then an aluminum layer is deposited thereon. Then, a selective etching is conducted to pattern the aluminum layer such that the aluminum layer covers the opening section. In this manner, the bonding pad section in which the aluminum layer is deposited is formed over the copper wiring. The reference also describes a method of depositing an aluminum layer and then removing excess portions of the aluminum layer by a CMP method to embed the aluminum layer in the opening section, instead of selectively etching and patterning the aluminum layer after the aluminum layer is deposited.

The presence of the aluminum layer over the surface of the bonding pad section provides an improved bonding property with respect to gold and the like.

However, the process described above has the following problems. When the aluminum layer is patterned by a selective etching after the copper layer is formed, the step of forming the aluminum layer, the photolithography step and the etching step are required in addition to the damascene process. This increases the number of process steps. Furthermore, the selective etching requires an etcher for aluminum layers that are not used in the damascene process. When the aluminum layer is planarized by a CMP method after the copper wiring is formed, such a CMP step is added. As a result, the number of process steps increases. Also, the process described in the reference requires a step of removing copper oxide formed on the exposed surface of the copper wiring by a gas containing oxygen plasma and hydrofluoric acid.

SUMMARY

One embodiment relates to a method for manufacturing a semiconductor device in which at least an uppermost wiring layer is formed by a damascene method. The method includes forming a dielectric layer in which an uppermost wiring layer is formed. The method also includes forming a wiring groove for the wiring layer having a specified pattern and an opening section for a bonding pad section in the dielectric layer. A first conduction layer is formed for the wiring layer. A second conduction layer is formed over the first conduction layer, the second conduction layer comprising a different material from that of the first conduction layer. Excess portions of the second conduction layer, the first conduction layer and the dielectric layer are removed to planarize the second conduction layer, the first conduction layer and the dielectric layer, to thereby form a wiring layer having at least the first conduction layer in the wiring groove and a bonding pad section including a base conduction layer of the first conduction layer and an exposed conduction layer of the second conduction layer in the opening section for the bonding pad section.

Another embodiment relates to a semiconductor device including a plurality of wiring layers and dielectric layers interposed between the mutual wiring layers, wherein an uppermost wiring layer and a bonding pad section are located at an identical level, and the bonding pad section includes at least a base conduction layer of a first conduction layer and an exposed conduction layer of a second conduction layer.

Another embodiment relates to a method for forming an upper wiring layer and a bonding pad in a semiconductor device, including forming an interlayer dielectric layer over a substrate, forming a mask layer over the interlayer dielectric layer, and forming an upper dielectric layer over the mask layer. The method also includes forming an upper wiring layer opening extending through the upper dielectric layer, the mask layer and the interlayer dielectric layer, and forming a bonding pad opening through the upper dielectric layer by etching through the upper dielectric layer. A first conductive material is deposited to simultaneously fill the upper wiring layer opening and partially fill the bonding pad opening. A bonding pad layer is deposited to fill the bonding pad opening, wherein the bonding pad layer is disposed over at least a portion of the first conductive material. The method also includes planarizing the device so that an upper surface of the first conductive material in the wiring layer opening and an upper surface of the bonding pad layer in the bonding pad opening are at the same level.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
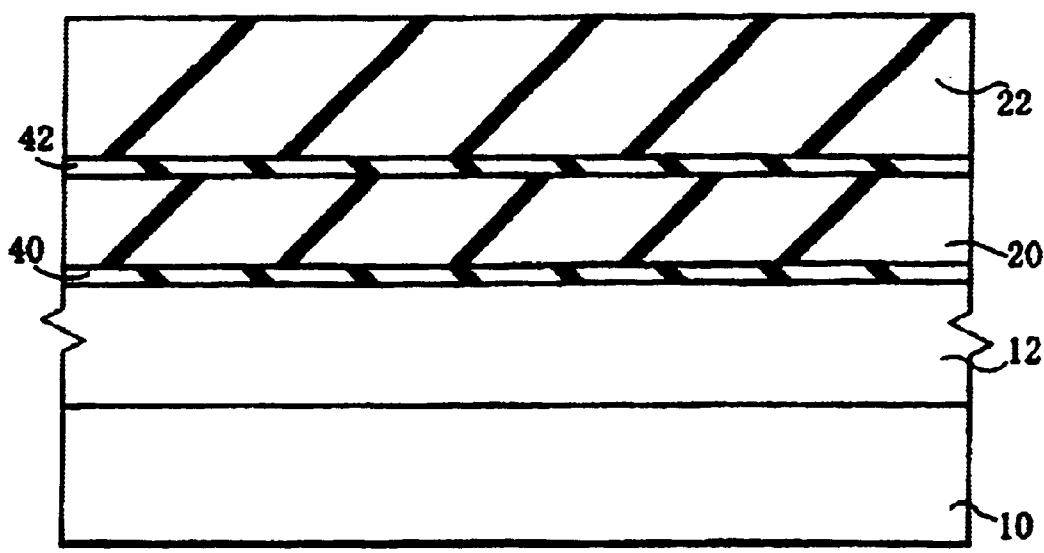
FIG. 1 schematically shows a cross-sectional view illustrating one step of a method for manufacturing a semiconductor device in accordance with an embodiment of the present invention.

In a method for manufacturing a semiconductor device in which a wiring layer is formed by a damascene method, it is an object of certain embodiments of the present invention to provide methods for manufacturing semiconductor devices and semiconductor 5 devices, in which a bonding pad section having a multiple-layered structure can be readily formed without increasing the number of process steps.

In a method for manufacturing a semiconductor device in accordance with one embodiment of the present invention, at least an uppermost wiring layer is formed by a damascene method, and the method comprises the steps (a)–(e) as follows: (a) forming a dielectric layer in which an uppermost wiring layer is formed; (b) forming a wiring groove for the wiring layer having a specified pattern and an opening section for bonding pad section in the dielectric layer; (c) forming a first conduction layer for the wiring layer; (d) forming a second conduction layer over the first conduction layer, the second conduction layer composed of a different material from a material of the first conduction layer; and (e) removing excess portions of the second conduction layer, the first conduction layer and the dielectric layer to planarize the second conduction layer, the first conduction layer and the dielectric layer, to thereby form a wiring layer having at least the first conduction layer in the wiring groove and a bonding pad section including a base conduction layer of the first conduction layer and an exposed conduction layer of the second conduction layer in the opening section for bonding pad section.

By the manufacturing method described above, the wiring groove for the uppermost wiring layer and the opening section for bonding pad section are formed in the uppermost dielectric layer. The first conduction layer and the second conduction layer for the wiring layer are deposited in a manner to bury the opening section. Moreover, the second conduction layer, the first conduction layer and the dielectric layer are planarized by a CMP method or the like, such that a wiring layer composed of the first conduction layer is formed in the wiring groove, and at the same time a base conduction layer of the first conduction layer and an exposed conduction layer of the second conduction layer in the opening section for bonding pad section. By different material it is meant that the materials have different compositions. For example, different materials may include the same element in differing quantities.

In accordance with this manufacturing method embodiment, the wiring layer and the bonding pad section can be simultaneously formed in a damascene process for forming the uppermost layer. Therefore, the bonding pad section can be formed with a simple process without increasing the number of steps of the damascene process or adding steps of forming and patterning other films after the damascene process, which improves the yield and reduces the cost.

In the step (c) described above, the first conduction layer may preferably be formed to have a film thickness smaller than a film thickness of the bonding pad section. By forming the first conduction layer to such a film thickness, the bonding pad section can have a multiple-layered structure including at least the first and second conduction layers. Also, in the step (c), the first conduction layer may preferably be formed in a manner that the wiring groove is generally embedded. As a result, the wiring layer composed of the first conduction layer is securely formed in the wiring groove.

Manufacturing methods in accordance with the present invention may also include the following embodiments.

(1) After the step (e), the manufacturing method may further include the step of forming a dielectric protection layer, wherein the protection layer is patterned in a manner to have an opening section that exposes the exposed conduction layer of the bonding pad section. By the inclusion of this step, an opening section for bonding can be formed in the protection layer formed in the uppermost layer. A material having a high bonding property can be selected for the exposed conduction layer that exposes through the opening section. As a result, good quality bonding with bumps and wires can be conducted.

(2) The wiring layer and the bonding pad section are formed by a known single-damascene method or a dual-damascene method.

(3) The method may further include, after the step (b), the step of forming a barrier layer over surfaces of the wiring groove and the opening section for the bonding pad. The barrier layer is formed from an appropriate material that may be selected based on the material of the wiring layer. For example, when the wiring layer is formed from a copper-base material, the barrier layer may be formed from a high-melting point metal, such as, for example, tantalum, titanium, tungsten, tantalum nitride, titanium nitride, tungsten nitride, and compounds including these metals.

(4) A material for the first conduction layer may be selected mainly in view of the function of a wiring layer. A material for the second conduction layer may be selected mainly in view of the function of a bonding pad. In view of these functions, the following combinations can be suggested as examples.

The first conduction layer may be formed from a metal layer composed of at least one type selected from aluminum, copper, silver and an alloy of the aforementioned metals, and the second conduction layer may be formed from a metal layer composed of at least one type selected from aluminum, gold and an alloy of the aforementioned metals.

(5) In addition, in the step (e) described above, the planarization can be conducted by a CMP method.

A semiconductor device in accordance with certain embodiments of the present invention includes a plurality of wiring layers and dielectric layers interposed between the mutual wiring layers, wherein an uppermost wiring layer and a bonding pad section are located at the same level, and the bonding pad section includes at least a base conduction layer of a first conduction layer and an exposed conduction layer of a second conduction layer.

In accordance with the semiconductor device described above, the bonding pad section may include at least the base conduction layer of the first conduction layer and the exposed conduction layer of the second conduction layer that is different from the base conduction layer. Therefore, when the wiring layer is formed with the first conduction layer, materials for the first conduction layer may be selected in view of the function of a wiring layer. Materials for the second conduction layer can be selected in view of the function of a bonding pad. As a result, the wiring layer and the bonding pad section can be highly optimized.

Selections and combinations of materials for the first conduction layer and the second conduction layer may be determined in view of the function of the wiring layer and the bonding pad section, film forming methods, device assembly methods, mounting methods and the like.

For example, when copper or copper alloy (hereafter referred to as "copper-base material") is used for the first conduction layer for the wiring layer, aluminum or aluminum alloy (hereafter referred to as "aluminum-base material") can be used for the second conduction layer for the exposed conduction layer of the bonding pad section. As a result, when gold, aluminum, an alloy thereof, or solder is used for bumps or wires, good quality bonding can be achieved.

In certain embodiments of a semiconductor device obtained by a manufacturing method in accordance with the present invention, the bonding pad section has at least a structure in its upper surface section in which the base conduction layer composed of the first conduction layer surrounds a periphery of the exposed conduction layer composed of the second conduction layer. Accordingly, by selecting an appropriate bonding material for the exposed conduction layer, and using this region as a bonding region, good quality bonding can be achieved.

Furthermore, a dielectric protection layer may preferably be formed over the layer including the uppermost dielectric layer, the wiring layer and the bonding pad section. The protection layer defines an opening section that exposes the exposed conduction layer of the bonding pad section. By this structure, even when the first conduction layer is not suitable for bonding, the base conduction layer composed of the first conduction layer need not exposed in the bonding region, and therefore does not affect the bonding region.

Certain preferred embodiments of the present invention are described below with reference to the accompanying drawings.

Figure 5:
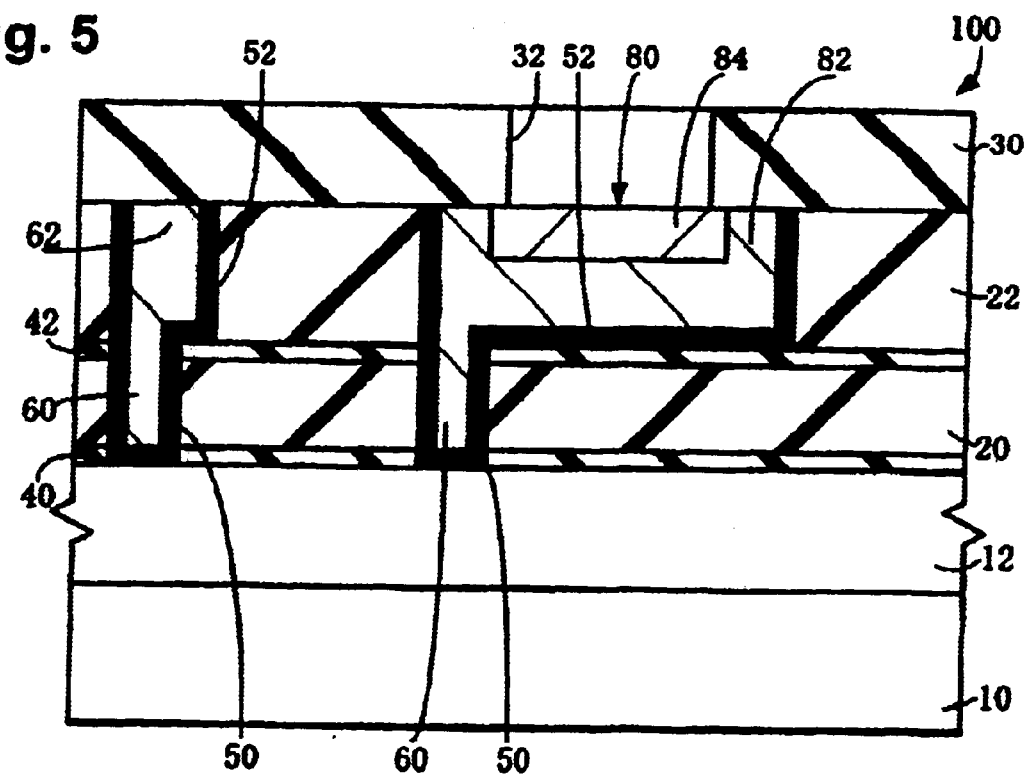
FIG. 5 schematically shows a cross-sectional view illustrating one step of a method for manufacturing a semiconductor device and the semiconductor device in accordance with an embodiment of the present invention.

A semiconductor device in accordance with an embodiment of the present invention is described. FIG. 5 schematically shows a cross-sectional view of a semiconductor device 100 in accordance with an embodiment of the present invention. FIG. 5 shows an example of a semiconductor device having an uppermost metal wiring layer and a bonding pad section.

The semiconductor device 100 has a layered structure in which an intermediate region 12 is formed over a silicon substrate 10. An uppermost interlayer dielectric layer 20 and an uppermost dielectric layer 22 are deposited over the intermediate region 12.

A via contact layer 60 is formed in the uppermost interlayer dielectric layer 20. An uppermost wiring layer 62 and a bonding pad section 80 (to be described below in greater detail) are formed in the uppermost dielectric layer 22.

In this example, a mask layer 42 is formed between the uppermost interlayer dielectric layer 20 and the uppermost dielectric layer 22. An interlayer barrier layer 40 is formed between the uppermost interlayer dielectric layer 20 and an underlying dielectric layer in the intermediate region 12. In other words, when a lower layer is an interlayer dielectric layer having a via-contact layer and an upper layer is a dielectric layer having a wiring layer, a mask layer is formed between these two layers.

The interlayer barrier layer may function in one aspect to prevent the materials of the wiring layer and the via-contact layer from diffusing in dielectric layers such as the interlayer dielectric layer. The mask layer may function as a mask and an etching stopper when via holes are formed by a dual-damascene method.

The interlayer barrier layer is provided, as needed, depending on the materials of the wiring layer and the via-contact layer. For, example, the interlayer barrier layer is provided when at least one of the wiring layer and the via-contact layer is composed of a material such as a copper-base material that is likely to diffuse into the dielectric layer that is composed of silicon oxide. The interlayer barrier layer may be formed from a material that can prevent copper diffusion, such as, for example, silicon nitride, silicon nitride oxide and silicon carbide. When the wiring layer and the via-contact layer are composed of materials such as aluminum-base materials that are difficult to diffuse into the dielectric layer that is composed of silicon oxide, the interlayer barrier layer is not necessarily required. However, even in such a case, the interlayer barrier layer may preferably be formed for processing purposes because it functions as an etching stopper.

Some of the layers of the embodiment shown in FIG. 5 are described below in greater detail.

Silicon substrate 10 and Intermediate region 12: Semiconductor devices such as MOSFETs, bipolar transistors and the like, wiring layers and element isolation regions may be formed on a surface of the silicon substrate 10.

The intermediate region 12 may have a known layered structure. For example, the intermediate region 12 may include one or more sets of an interlayer dielectric layer formed with an interlayer contact layer such as a via-contact layer and a dielectric layer formed with a wiring layer.

Uppermost interlayer dielectric layer 20: The uppermost interlayer dielectric layer 20 is formed over the intermediate region 12 through the interlayer barrier layer 40. The via-contact layer 60 is formed in the uppermost interlayer dielectric layer 20. The via-contact layer 60 connects a wiring layer in the intermediate region 12 that is formed below the uppermost interlayer dielectric layer 20 to the uppermost wiring layer 62. The via-contact layer 60 has side and bottom surfaces that are preferably covered by a barrier layer 50.

Uppermost dielectric layer 22: The uppermost dielectric layer 22 is formed over the uppermost interlayer dielectric layer 20 through the mask layer 42. The uppermost wiring layer 62 and the bonding pad section 80 are formed at specified locations of the uppermost dielectric layer 22.

The via-contact layer 60 and the uppermost wiring layer 62 are integrally formed from a conductive material that is filled in an opening section having a specified pattern. The barrier layer 52 is formed over a surface of the uppermost wiring layer 62 (except an upper surface of the wiring layer 62). The barrier layer 50 formed over the surface of the via-contact layer 60 and the barrier layer 52 formed over the surface of the uppermost wiring layer 62 may be formed in the same film forming step and connected to each other in one piece. Similarly, the barrier layers 50 and 52 are continuously formed over surfaces of the via-contact layer 60 and the bonding pad section 80 (except an upper surface of the bonding pad section 80), respectively. In this embodiment, the bonding pad section 80 is connected to a lower wiring layer through the via-contact layer 60.

The barrier layer is provided, as needed depending on the materials of the wiring layer and the via-contact layer. For example, the barrier layer is provided when the wiring layer and the via-contact layer are composed of a material such as a copper-base material that is likely to diffuse into a dielectric layer that is composed of silicon oxide. The barrier layer may be formed from a material that can prevent copper diffusion such as a high-melting point metal, such as, for example, tantalum, titanium, tungsten, a nitride thereof, or a stacked layered body of the aforementioned materials.

When the wiring layer and the via-contact layer are composed of materials such as aluminum-base materials that are difficult to diffuse into the dielectric layer that is composed of silicon oxide, the barrier layer is not necessarily required. However, even in such a case, a layer composed of one of high-melting point metals or a compound thereof may preferably be formed over surfaces of the wiring layer and the via-contact layer in order to improve the embedding property and contact resistance of the wiring material.

In accordance with certain embodiments of the present invention, the stacked layered structure of the barrier layer and the wiring layer may be formed from Ti/TiN/Al—Cu, Ti/Al—Cu, Ta/TaN/Al—Cu, Nb/Al—Cu and the like, when the wiring layer is mainly formed from an aluminum alloy layer. The stacked layered structure may be formed from Ti/TiN/Cu, Ta/TaN/Cu, WN/Cu and the like when the wiring layer is mainly formed from copper.

Bonding pad section 80: The bonding pad section 80 includes the barrier layer 52, a base conduction layer 82 formed along an internal wall of the barrier layer 52, and an exposed conduction layer 84 formed inside the base conduction layer 82. In other words, the bonding pad section 80 has a multiple-layered structure of the base conduction layer 82 and the exposed conduction layer 84. The base conduction layer 82 is formed in the same step in which the uppermost wiring layer 62 is formed, and consequently has the same material as that of the wiring layer 62. The exposed conduction layer 84 is formed to have at least a region that enables bonding. Also, the exposed conduction layer 84 is formed from a material different from that of the base conduction layer 82, and the material thereof may be selected in consideration of the bonding property, cohesion with respect to the base conduction layer 82, anti-corrosion property, moisture resistance property and assembly and mounting property.

For example, when a copper-base material is used for the uppermost wiring layer 62, an aluminum-base material or a gold-base material may be used for the exposed conduction layer 84 of the bonding pad section 80. As a result, good quality wire bonding using gold or aluminum, and good quality bonding by bumps using gold, silver, lead or solder can be achieved.

Protection layer 30: A dielectric protection layer 30 may be formed over the uppermost layer. The protection layer 30 protects the functions within the semiconductor device 100, and can be formed from a known protection layer, such as, for example, a silicon nitride layer, a silicon oxide layer, or a silicon oxide nitride layer. The protection layer 30 defines an opening section 32 that exposes a specified regions of the exposed conduction layer 84 of the bonding pad section 80. The protection layer 30 may be formed from a plurality of stacked layers including, for example, a silicon oxide layer, a silicon nitride layer and the like, if required. Furthermore, a resin layer composed of, for example, polyimide resin for alleviating stresses can be deposited over the above-described various silicon compound layers.

Figure 6:
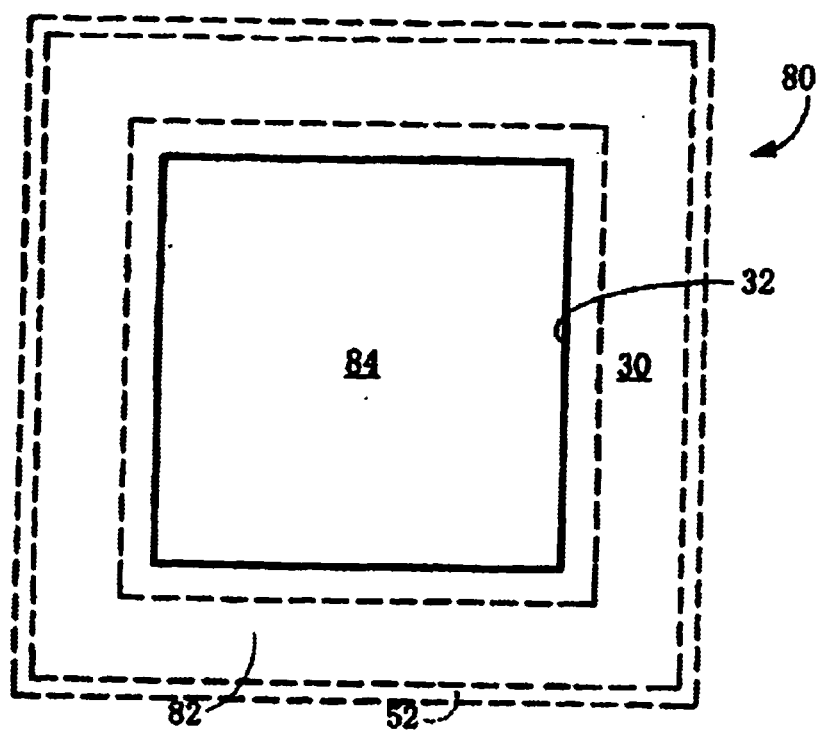
FIG. 6 schematically shows a partial plan view of a bonding pad section of the semiconductor device shown in FIG. 5.

FIG. 6 schematically shows a plan view of a region that includes the bonding pad section 60. The bonding pad section 80 has a plan structure in which the barrier layer 52, the base conduction layer 82 and the embedded connection layer 84 in this order from the outer layer are concentrically arranged. The exposed conduction layer 84 is located within the opening section 32 of the protection layer 30. The exposed surface of the exposed conduction layer 84 defines a bonding region.

In accordance with the semiconductor device 100, the uppermost wiring layer 62 is formed from a first conduction layer, and the bonding pad section 80 includes the base conduction layer 82 composed of the first conduction layer and the exposed conduction layer 84 composed of a second conduction layer that is different from the base conduction layer 82. Therefore, materials for the first conduction layer may be selected mainly in view of the function of a wiring layer, and materials for the second conduction layer may be selected mainly in view of the function of a bonding pad. As a result, the wiring layer and the bonding pad section can be highly optimized.

For example, if a copper-base material is used as a material for the first conduction layer, and an aluminum-base material is used as a material for the second conduction layer, the base conduction layer 82 that is formed from a copper-base material that likely forms an oxide film is not exposed. Therefore, good quality bonding can be performed.

Next, a method for manufacturing the semiconductor device 100 in accordance with an embodiment of the present invention is described. FIGS. 1 through 5 schematically show cross-sectional views of the semiconductor device 100 in different manufacturing steps.

First, the description is made with reference to FIG. 1. FIG. 1 shows a step in which an uppermost interlayer dielectric layer 20 and an uppermost dielectric layer 22 are formed over an intermediate region 12. Each of wiring layers and via-contact layers can be formed by a known damascene process, for example by a dual-damascene process in accordance with the present embodiment.

Formation of Semiconductor Devices and Intermediate Region 12: Semiconductor elements such as MOSFETs, bipolar transistors and the like, wiring layers and element isolation regions (not shown) are formed over a surface of a silicon substrate 10. Then, one or more sets of an interlayer dielectric layer in which an interlayer contact layer such as a via-contact layer is formed and a dielectric layer in which a wiring layer is formed are formed in layers over the silicon substrate 10 in which the semiconductor devices are formed by a known method to thereby form the intermediate region 12. The wiring layers and via-contact layer in the intermediate layer 12 can be formed by a known damascene process.

Formation of Uppermost Interlayer Dielectric Layer 20 and Uppermost Dielectric Layer 22: First, an uppermost dielectric layer (not shown) of the intermediate region 12 and wiring layers (not shown) formed in the uppermost dielectric layer of the intermediate region 12 are planarized by, for example, a CMP method, and then an interlayer barrier layer 40 is formed. The material of the interlayer barrier layer is not particularly limited to a specific type as long as it can function as a barrier layer as described above. For example, the interlayer barrier layer may be formed from silicon nitride, silicon nitride oxide and silicon carbide. Furthermore, the interlayer barrier layer may preferably be formed from a material that can function as an etching stopper layer at a bottom of a via hole that is to be formed. The interlayer barrier layer may be formed by, for example, a sputter method and a CVD method. Also, the thickness of the interlayer barrier layer is selected in a range that can achieve its intended function.

Then, an uppermost interlayer dielectric layer 20 is formed over the interlayer barrier layer 40. The uppermost interlayer dielectric layer 20 is preferably formed from a known layer mainly composing silicon oxide. The interlayer dielectric layer 20 can be formed by, for example, a high-density plasma CVD method, a thermal CVD method, a plasma CVD method, a normal-pressure CVD method, a coating method such as a spin-coat method, a sputter method and a thermal vapor deposition method. The thickness of the interlayer dielectric layer 20 is selected depending on device designs.

Then, a mask layer 42 is formed over the uppermost interlayer dielectric layer 20. The material for the mask layer is not limited to a particular type as long as it can function as a mask layer. For example, the mask layer can be formed from silicon nitride, silicon nitride oxide and silicon oxide. Furthermore, the mask layer may preferably be formed from a material that can function as an etching stopper when via holes are formed. The mask layer 42 may be formed by, for example, a CVD method. Also, the thickness of the mask layer is selected in a range that can achieve its intended function.

Then, an uppermost dielectric layer 22 is formed over the mask layer 42. The uppermost dielectric layer 22 is formed from a known layer mainly composing silicon oxide. The uppermost dielectric layer 22 may be formed by the same film forming method used for forming the uppermost interlayer dielectric layer 20.

The thickness of each of the layers is determined based on the design rule or the like. Examples of film thickness of the respective layers are shown below.

Figure 2:
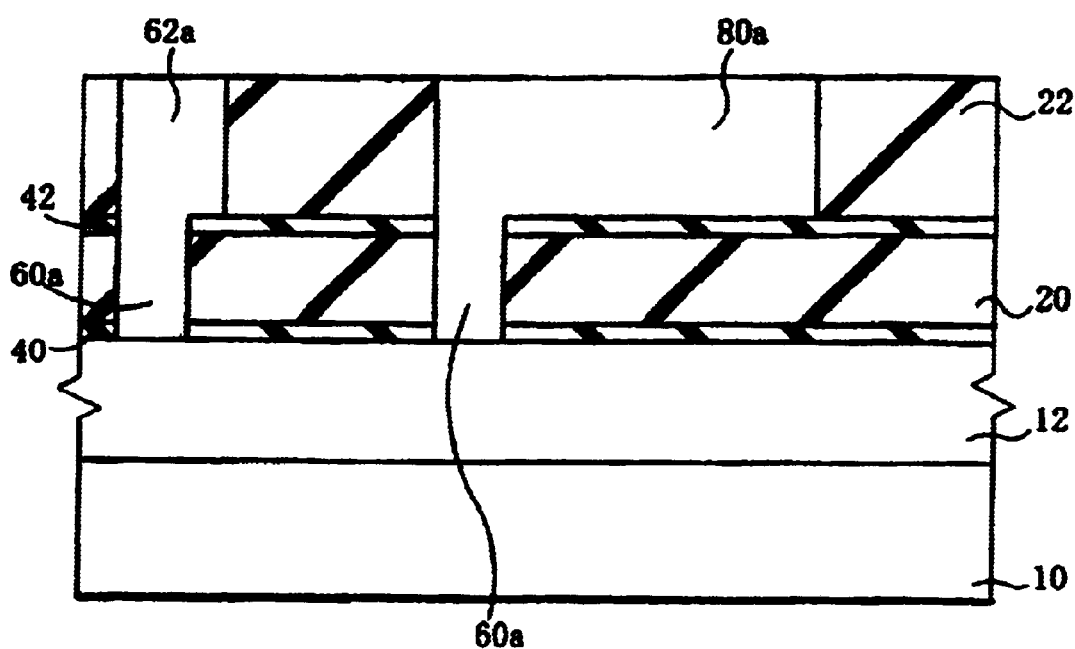
FIG. 2 schematically shows a cross-sectional view illustrating one step of a method for manufacturing a semiconductor device in accordance with an embodiment of the present invention.

Interlayer barrier layer 40: several ten~200 nm
Uppermost interlayer dielectric layer 20: several hundred~1500 nm
Mask layer 42: several ten~200 nm
Uppermost dielectric layer 22: 500~2000 nm As shown in FIG. 2, an uppermost via-hole 60a, a wiring groove 62a and an opening section 80a for the bonding pad section are formed.

In this process, for example, the uppermost dielectric layer 22 is patterned by a photolithography and etching (e.g., photo-etching) to form the wiring groove 62a. Then, opening sections are formed by a photo-etching method in the mask layer 42 at specified locations (where via-holes are formed), and then the uppermost interlayer dielectric layer 20 is etched using the mask layer 42 as a mask to form the via-holes 60a. In this process, the opening section 80a for the bonding pad section is formed at the same time when the wiring groove 62a is formed.

In this process, an opening section in which the via-hole 60a continuously connects to the wiring groove 62a and an opening section in which the via-hole 60a continuously connects to the opening section 80a for the bonding pad section are formed.

An etching method, preferably a dry etching method, and more preferably a high-density plasma etching may be used to form the wiring groove and the via-holes. When the dry etching method is used, its etching conditions (for example, etchant, plasma density, pressure and temperature) may be adjusted to change the etching rate for the dielectric layer and the etching rate for the mask layer independently from one another.

The formation of the wiring groove and the via-holes by a dual-damascene method is not limited to the method described above, and can use another method. For example, instead of the method described above, a via-fast method can be utilized. According to the via-fast method, the via-holes 60a that pass through the uppermost dielectric layer 22 and the uppermost interlayer dielectric layer 20 are formed first, and then, the wiring groove 62a is formed in the dielectric layer 22.

Figure 3:
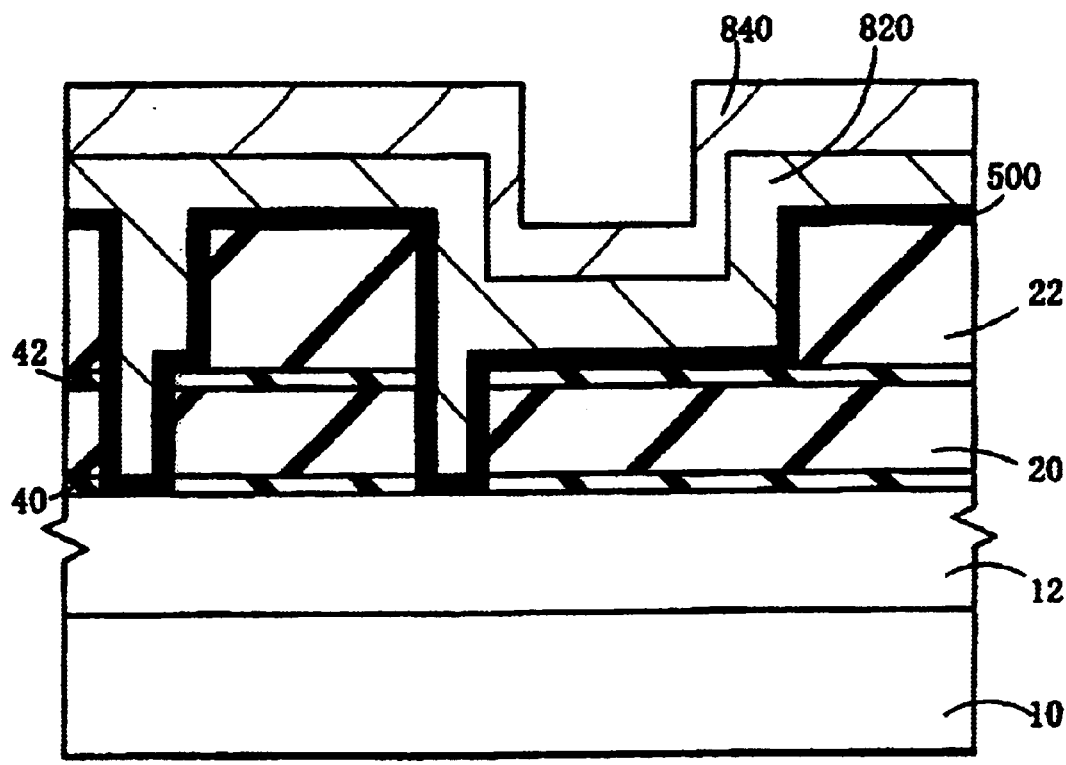
FIG. 3 schematically shows a cross-sectional view illustrating one step of a method for manufacturing a semiconductor device in accordance with an embodiment of the present invention.
Figure 4:
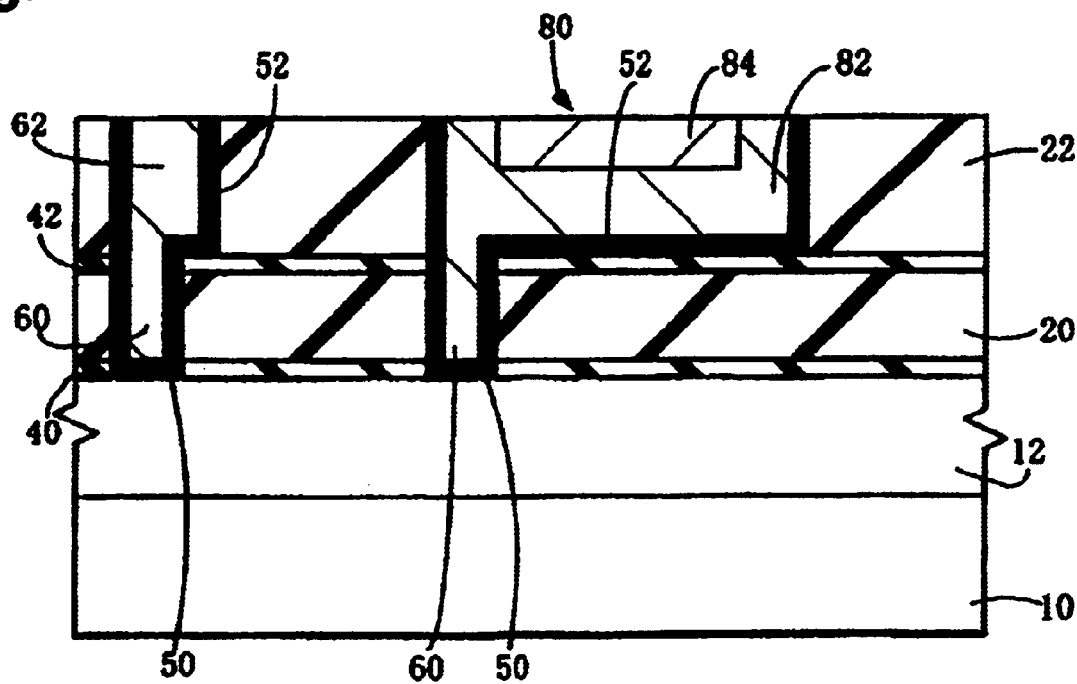
FIG. 4 schematically shows a cross-sectional view illustrating one step of a method for manufacturing a semiconductor device in accordance with an embodiment of the present invention.

As shown in FIGS. 3 and 4, an uppermost via-contact layer 60 and an uppermost wiring layer 62 are formed.

First, as shown in FIG. 3, a barrier layer 500 is preferably formed along internal walls of the via-holes 60a, the wiring groove 62a and the opening section 80a for the bonding pad section (see FIG. 2). The barrier layer 500 may preferably be formed by a sputter method or a CVD method. The film thickness of the barrier layer 500 is selected to be in a range that can achieve its intended function, and is 10~100 nm, for example.

Then, a first conduction layer 820 for via-contact layers and wiring layers is formed over the barrier layer 500, and then a second conduction layer 840 for the bonding pad section is formed.

In one embodiment, the first conduction layer 820 is formed first. In this instance, the first conduction layer 820 is formed in a manner that at least the via-holes 60a and the wiring groove 62a are buried by the conduction layer 820. Therefore, the thickness of the first conduction layer 820 is set depending on the diameter of the via-hole 60a and the width of the wiring groove 62a. It is noted that the thickness of the first conduction layer 820 refers to, for example, the film thickness of the conduction layer over the uppermost dielectric layer 22.

Also, the film thickness of the first conduction layer 820 needs to be smaller than the thickness of the bonding pad section 80 (see FIG. 4), in other words, the film thickness of the uppermost dielectric layer 22 (see FIG. 4) that is finally obtained. If the film thickness of the first conduction layer 820 is greater than the film thickness of the uppermost dielectric layer 22 that is finally obtained, the exposed conduction layer 84 (see FIG. 4) cannot remain over the bonding pad section 80.

The first conduction layer 820 may be formed by, for example, a CVD method, a method using plating, a sputter method, a vapor deposition method, a coating method or a method combining the aforementioned methods.

When a copper-base material is used for the first conduction layer 820, the layer can be formed by, for example, a sputter method, a plating method or a CVD method. For example, when a plating method is used, copper is preferably deposited to a film thickness of several ten~several hundred nm as a seed layer over the surface of the barrier layer 500 by using a sputter method, and then, copper is formed thereon to a specified film thickness (for example, 300~1000 nm) by a plating method.

Then, depending on the requirements, a layer of metal such as titanium, tantalum, niobium or tungsten, or a layer of alloy of the aforementioned metals (not shown) is formed to a preferred film thickness of several ten nm by a sputter method. Such a layer may function as a cohesion layer and a flow layer.

Next, a second conduction layer 840 is formed over the first conduction layer 820. The second conduction layer 840 may be formed by the same method used for forming the first conduction layer 820.

The second conduction layer 840 forms the exposed conduction layer 84 of the bonding pad section 80, and therefore may preferably be formed with a metal having a good bonding property, as described above. When an aluminum-base material is used for the second conduction layer 840, the conduction layer 840 can preferably be formed to a film thickness of several hundred nm by a sputter method.

The film thickness ratio between the first conduction layer 820 and the second conduction layer 840 and the size of the opening section 80a for the bonding pad section 80 may be controlled to set an area ratio between upper surfaces of the base conduction layer 82 and the exposed conduction layer 84 of the bonding pad section 80.

Examples of the width of the wiring groove 62a, the diameter of the opening section 80a for the bonding pad section 80, the film thickness of the first conduction layer 820 and the film thickness of the second conduction layer 840 are shown below.

The width of the wiring groove: 0.15~10 $\mu$m

The diameter of the opening section for the bonding pad section: 30~150 $\mu$m

The film thickness of the first conduction layer: 300~1000 nm

The film thickness of the second conduction layer: 100~500 nm

As shown in FIGS. 3 and 4, excess portions of the second conduction layer 840, the first conduction layer 820, the barrier layer 500 and the uppermost dielectric layer 22 are planarized, to thereby form the uppermost dielectric layer 22, the uppermost wiring layer 62 and the bonding pad section 80. As described above, the bonding pad section 80 has a stacked layered structure in which the exposed conduction layer 84 is deposited over the base conduction layer 82. In one embodiment, the exposed conduction layer 84 covers a specified region of the base conduction layer 82.

The planarization method may be conducted by using, for example, a CMP method, a dry etching method or a wet removal method, and more preferably by a CMP method.

As shown in FIG. 5, a dielectric protection layer 30 is formed over the uppermost layer, in other words, the uppermost dielectric layer 22. The protection layer 30 may be formed by a material layer, such as, for example, a silicon nitride layer, a silicon oxide layer and a silicon oxide nitride layer, as described above. An opening section 32 is formed in the protection layer 30 by photolithography and etching in a manner that a specified region of the exposed conduction layer 84 of the bonding pad section 80 is exposed.

In the manner described above, the semiconductor device 100 in accordance with an embodiment of the present invention is completed.

In the manufacturing method described above, as shown in FIG. 2, the wiring groove 62a for the uppermost wiring layer 62 as well as the opening section 80a for the bonding pad section 80 are formed in the uppermost dielectric layer 22. Then, as shown in FIG. 3, the first conduction layer 820 for the wiring layer 62 and the second conduction layer 840 are deposited in a manner to fill the opening section 80a for the bonding pad section 80. Furthermore, as shown in FIG. 4, the second conduction layer 840, the first conduction layer 820 and the uppermost dielectric layer 22 are planarized such that the wiring layer 62 composed of the first conduction layer 820 is formed in the wiring groove 62a, and at the same time, the base conduction layer 82 composed of the first conduction layer 820 and the exposed conduction layer 84 composed of the second conduction layer 840 are formed within the opening section 80a for the bonding pad section 80.

As described above, in certain embodiments the wiring layer 62 and the bonding pad section 80 may be simultaneously formed in a damascene process (a dual-damascene process in accordance with the present embodiment) for forming the uppermost wiring layer 62. Therefore, the bonding pad section 80 can be formed with a simple process without increasing the number of steps of the damascene process or adding steps of forming and patterning other films after the damascene process, which improves the yield and reduces the cost.

For example, even when a copper-base material is used as a material for the wiring layer 62, surfaces of the base conduction layer 82 composed of the copper-base material can be covered by an aluminum-base material if an aluminum-base material is used for the exposed conduction layer 84. As a result, the above-described step of the conventional technique using a wet etching method to remove a copper oxide film that is formed during the photo-etching step and the step of removing the resist layer is not required. Also, before the second conduction layer 840 composed of an aluminum-base material is formed, a relatively simple RF sputter apparatus can be used, if required, to remove a thin copper oxide film that is formed on the surface of the first conduction layer 82 that is composed of a copper-base material. Accordingly, the contact resistance between the base conduction layer 82 and the exposed conduction layer 84 can be minimized.

Wiring layers at different levels may be formed with the same material or different materials. For example, a wiring layer that is close to the silicon substrate may be formed from an aluminum-base material and an upper layer that is fed with a larger current may be formed from a copper-base material.

Furthermore, in the embodiment described above, the bonding pad section is composed of two conduction layers. However, the bonding pad section can be composed of three or more layers depending on the requirements. A variety of combinations of the base conduction layer and the exposed conduction layer can be employed according to the device assembly method, the mounting method and the like. For example, combinations of the base conduction layer and the exposed conduction layer include layers of copper-base material—gold-base material, aluminum-base material—gold-base material, silver-base material—aluminum-base materials, gold-base materials.

Also, the plan shape of the bonding pad section is not limited to square, but can be any one of a variety of shapes, such as, for example, parallelogram such as rectangle, polygon such hexagon, circle and the like.

In summary, certain embodiments of the present invention are applicable to a semiconductor device in which uppermost wiring layers are formed by a damascene process, and enables simultaneous formation of the uppermost wiring layers and bonding pad sections in a common step. The present invention is not limited to the embodiments described above and various modifications can be made within the scope of the subject matter of the invention.

What is claimed:

1. A semiconductor device comprising:

a plurality of wiring layers and dielectric layers interposed between the wiring layers, wherein an uppermost wiring layer and a bonding pad section are located at an identical level, the uppermost wiring layer comprising a first wiring material, the bonding pad section including at least a base conduction layer of the first wiring material and a second conduction layer comprising a conductive material having a different composition than the first wiring material, wherein the bonding pad section includes an upper surface section in which the base conduction layer and the second conduction layer are exposed.

2. A semiconductor device according to claim 1, wherein the upper surface section includes an exposed surface of the base conduction layer that surrounds a periphery of the exposed conduction layer.

3. A semiconductor device according to claim 1, further comprising an uppermost dielectric protection layer, the protection layer defining an opening section including the exposed regions of the base conduction layer and the second conduction layer.

4. A semiconductor device according to claim 1, wherein:

the base conduction layer is formed from a metal layer comprising at least one material selected from aluminum, copper, silver and alloys thereof, and the second conduction layer is formed from a metal layer comprising at least one material selected from aluminum, gold and alloys thereof.

5. A semiconductor device according to claim 1, further comprising a barrier layer under the wiring layer and under the base conduction layer of bonding pad.

6. A semiconductor device as in claim 1, wherein:

the uppermost wiring layer has a width of 0.15 nm to 10 $\mu$m;

the bonding pad section has a diameter of 30 nm to 150 $\mu$m;

the base conduction layer has a thickness of 300 nm to 1000 nm in the bonding pad section beneath the second conduction layer; and the second conduction layer has a thickness of 100 nm to 500 nm in the bonding pad section.

* * * * *